US011366004B2

(12) United States Patent
Tagliavini et al.

(10) Patent No.: US 11,366,004 B2
(45) Date of Patent: Jun. 21, 2022

(54) ELECTRONIC DEVICE FOR DETECTING THE WEIGHT OF CAPSULES FOR PHARMACEUTICAL PRODUCTS

(71) Applicant: MG 2- S.R.L., Pianoro (IT)

(72) Inventors: Antonio Tagliavini, Bologna (IT); Andrea Ferrari, Bologna (IT); Nicola Querzani, Pianoro (IT); Mauro Minghetti, Bologna (IT)

(73) Assignee: MG 2—S.R.L., Pianoro (IT)

(*) Notice: Subject to any disclaimer, the term of this patent is extended or adjusted under 35 U.S.C. 154(b) by 589 days.

(21) Appl. No.: 16/507,761

(22) Filed: Jul. 10, 2019

(65) Prior Publication Data
US 2020/0025602 A1    Jan. 23, 2020

(30) Foreign Application Priority Data

Jul. 18, 2018 (IT) .......................... 102018000007288

(51) Int. Cl.
*H03F 3/45* (2006.01)
*G01G 7/00* (2006.01)

(52) U.S. Cl.
CPC .............. *G01G 7/00* (2013.01); *H03F 3/45* (2013.01); *H03F 2200/48* (2013.01)

(58) Field of Classification Search
CPC ...... G01G 7/00; G01G 23/365; G01G 23/363; G01G 17/00; G01G 7/06; H03F 3/45; H03F 2200/48
USPC .............................. 330/252–261, 295, 124 R
See application file for complete search history.

(56) References Cited

U.S. PATENT DOCUMENTS 5,750,938 A * 5/1998 De Caris ................ G01G 17/00
                                                       177/83

FOREIGN PATENT DOCUMENTS

| EP | 1 982 687 | 10/2008 |
| WO | 2010/070592 | 6/2010 |
| WO | 2014/009040 | 1/2014 |

OTHER PUBLICATIONS

Italian Search Report for Corresponding Application IT 201800007288 Filed Jul. 18, 2018.

* cited by examiner

*Primary Examiner* — Hieu P Nguyen
(74) *Attorney, Agent, or Firm* — Gottlieb, Rackman & Reisman, P.C.

(57) ABSTRACT

An electronic device for detecting the weight of a capsule for a pharmaceutical product is provided with: a plurality of detection electrodes, which face a respective one of a plurality of sectors into which the capsule is divided in a main extension direction thereof, each one of the detection electrodes forming a respective detection capacitor with a common plate defined by a capsule-holding element which holds the capsule; and an electronic circuit having a plurality of detection stages, each operatively coupled to a respective one of the detection electrodes so as to detect, in an independent and exclusive manner, a capacitive variation of the respective detection capacitor and to generate a respective output quantity, which is a function of the capacitive variation and indicative of the weight of the respective sector of the capsule.

15 Claims, 6 Drawing Sheets

ELECTRONIC DEVICE FOR DETECTING THE WEIGHT OF CAPSULES FOR PHARMACEUTICAL PRODUCTS

CROSS-REFERENCE TO RELATED APPLICATIONS

This patent application claims priority from Italian patent application no. 102018000007288 filed on Jul. 18, 2018, the entire disclosure of which is incorporated herein by reference.

TECHNICAL FIELD

The present solution relates to an electronic device for detecting the weight of capsules, in particular capsules filled wholly or partially with a pharmaceutical product.

BACKGROUND OF THE INVENTION

In the pharmaceutical sector, machines are known for filling capsules with a pharmaceutical product. These machines are designed to fill the bottoms of a plurality of capsules with precise doses of at least one pharmaceutical product and to close these bottoms with corresponding caps in order to obtain the respective full capsules as a finished product.

In some types of machines, once filled, the capsules coming out of the filling machine are weighed by means of devices designed to measure the weight of the capsule and the pharmaceutical product contained therein. In general, this measurement is made with electromechanical devices (dynamometric scales) and, except in special cases, on samples, since these scales are very slow compared to the production rate of the machine. Furthermore, this technique measures the gross weight, with the consequence that the assessment of the net weight is affected by uncertainty related to the weight of the casing, a nominal value—and not a measured value—being subtracted from the gross weight.

A known technique used for weight detection, in particular in machines of this type manufactured by the Applicant, is the capacitive measurement technique (see for example U.S. Pat. No. 5,750,938 in the name of the Applicant), which allows both measurement over the entire production and detection of the net weight of the content, by means of the subsequent measurement of gross weight and tare weight on the capsule. The advantages compared to the dynamometric system are evident, since the measurement of the weight over the entire production allows not only to verify the dosage trend (and therefore the correct adjustment of the machine) but also the control and possible rejection of the single capsule, moreover operating on the net and not on the gross weight.

As schematically shown in FIG. 1, the filled capsules (for the sake of simplicity, only one is shown in FIG. 1, indicated with 1) are transferred to a capsule-holding wheel 2, provided with a plurality of seats 3, or grooves, designed to receive and hold, each, a respective capsule 1, by means of a vacuum system (not shown herein).

A weighing device 4, placed in front of the capsule-holding wheel 2, detects the weight of the capsule 1 and the pharmaceutical product contained therein, by means of a capacitive technique.

In particular, as described in the above-mentioned patent, the weighing device 4 comprises a capacitive sensor consisting of a detection capacitor having a capacity $C_t$ (hereinafter, for brevity, detection capacitor $C_t$) having a first plate 5a, consisting of an electrode arranged at its wall facing the capsule-holding wheel 2, and a second plate 5b consisting of the same capsule-holding element 2. During the rotation of the capsule-holding wheel 2, the capsule 1 is interposed between the first and the second plates 5a, 5b of the capacitive sensor, resulting in a capacitive variation $\Delta C$ of the detection capacitor $C_t$.

The weighing device 4 comprises a detection circuit 6, operatively coupled to the detection capacitor $C_t$ and configured to generate an output signal, for example a voltage (or a frequency, in certain circuit designs), indicative of the weight of capsule 1, depending on the capacitive variation $\Delta C$ caused by the presence of the capsule 1 between the first and second plates 5a, 5b of the detection capacitor $C_t$.

FIG. 2 shows a possible implementation of the above-mentioned detection circuit 6, of the "capacitive divider" type, used to detect the capacitive variation $\Delta C$ of the detection capacitor $C_t$, having a plate (the above-mentioned second plate 5b consisting of the capsule-holding element 2) placed at a reference potential (the capsule-holding element 2, as part of the machine, is in fact intrinsically connected to the earth potential).

The detection circuit 6 comprises an operational amplifier 7 connected in unity-gain configuration with high input impedance (as a "buffer"), having a non-inverting input connected to the first plate 5a of the detection capacitor $C_t$ and an inverting input connected to the output, on which it provides an output voltage $V_{out}$. The above-mentioned inverting input of the operational amplifier 7 is also connected, by means of a coupling capacitor 8 having a capacity $C_o$, to an oscillator 9 providing an oscillator voltage $V_{osc}$ (which, typically, can have frequencies from tens of kHz to hundreds of MHz and amplitudes from a few volts to several tens of volts).

The present Applicant has realized that the above-mentioned detection circuit 6 has some intrinsic limitations, which may be considerable under certain operating conditions (as will also be highlighted below); these limitations are as follows.

(a) Dynamic—first of all, in the detection circuit 6, the condition $C_o \approx C_t$ is normally required in order to obtain the maximum sensitivity with respect to the percentage variations of the detection capacitor $C_t$; in these conditions, at the input (and output) of the operational amplifier 7 there is a voltage equal to half the oscillator voltage $V_{osc}$.

(b) Desensitization—in this configuration, the capacity variations $\Delta C$ of the transducer refer to the equivalent capacity in parallel $C_o + C_t$, and not only to the capacity $C_t$.

(c) Common mode—having to work on a so-called "common mode" signal with a high amplitude, the operational amplifier 7 can introduce a non-linearity; moreover, the dynamics of the same operational amplifier 7 limits the maximum value of the oscillator voltage $V_{osc}$ (for example, if the operational amplifier 7 is powered at 5V, and if, as assumed, $C_o \approx C_t$, the oscillator voltage $V_{osc}$ must be less than $10V_{pp}$). This is an important limitation, especially in applications such as this one, where the transducer size is very small and therefore the sensitivity is reduced, since the oscillator voltage $V_{osc}$ has to be increased in order to increase the signal-to-noise ratio.

(d) Guard—as shown schematically in FIG. 2, the possibility of driving guard lines (or conductors), indicated with G, can be requested both to reduce the parasitic input capacities and to drive on-board electrodes able to suitably modify the trend of the electric field lines. The guard lines G can be driven from the output of the operational amplifier 7, as shown in FIG. 2, but this can cause instability problems, as the operational amplifier 7 can hardly tolerate the capacitive load, particularly when driving it with a high amplitude and frequency signal.

(e) Zero-setting—there are also further problems regarding the zero-setting of the output signal by the operational amplifier 7, which is in fact relatively complex, due to the signal amplitude that has to be applied (with the consequent possibility of distortion and phase shifts in the detection circuit 6).

The above-mentioned weighing device 4 can, according to the extensive experience acquired by the Applicant, in any case be successfully used in filling machines, in order to verify the weight of the capsules and the correct dosage of the product contained therein.

However, the present Applicant has verified that a further problem occurring on some filling machines is the detection of the presence of a capsule cap. For various reasons, a capsule coming out of the filling machine may not have a cap, and it is therefore necessary to identify and discard this capsule.

Known solutions to detect the presence of the cap require the use of a photoelectric sensor, which however has shown drawbacks and difficulties related to the correct identification of the capsules to be discarded, due to differences in colour and/or size, positioning, dust, etc.).

SUMMARY OF THE INVENTION

The purpose of the present invention is to provide a solution that allows to overcome the drawbacks previously highlighted of the known art.

According to the present invention, a device is provided for detecting the weight of a capsule for pharmaceutical products, as defined in the attached claims.

BRIEF DESCRIPTION OF THE DRAWINGS

In order to better understand the present invention, non-limiting preferred embodiments thereof will now be described by way of example with reference to the accompanying drawings, in which.

DETAILED DESCRIPTION OF THE INVENTION

As will be discussed in detail below, one aspect of the present solution envisages providing an electronic device for detecting the weight of a capsule for a pharmaceutical product, defining a "segmented" capacitive sensor, i.e. having a plurality of detection segments, each defining a respective detection capacitor "focused" on a respective part (or sector) of the capsule (understood as divided in height, or along its main extension direction).

This "segmented" capacitive sensor is able to provide not only "on/off" information about the presence/absence of the capsule cap, but also, advantageously, information about the amount of material present in the various sectors in which the capsule can be divided. As will be clearer in the following, this focusing, and therefore the possibility of having from each sensor the information relating to the relevant part of the capsule, depends on the provision of suitable electronics.

Figure 1:
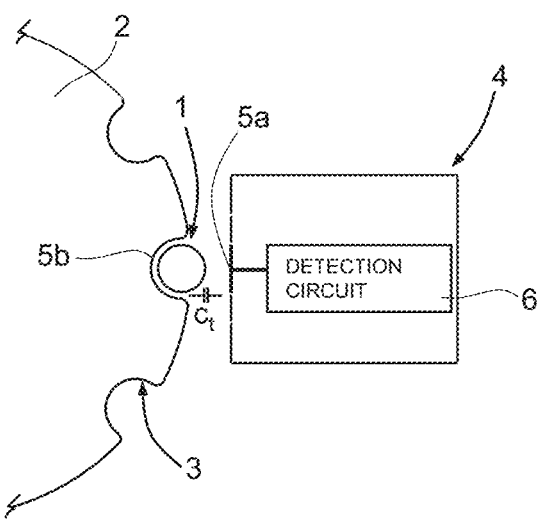
FIG. 1 schematically shows a portion of a capsule filling machine for pharmaceutical products.
Figure 3:
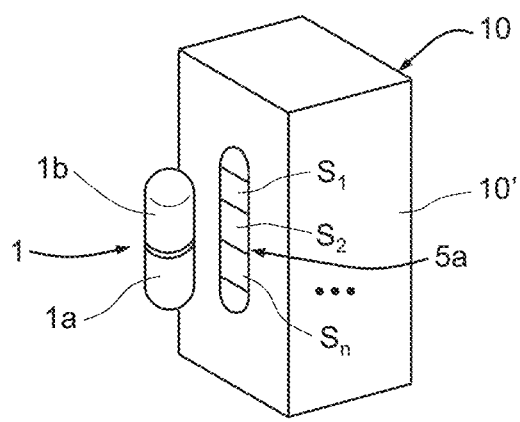
FIG. 3 shows schematically a capsule weighing device according to an embodiment of the present solution.

FIG. 3 shows schematically an electronic weighing device defining a "segmented" capacitive sensor according to an embodiment of the present solution, facing a capsule, again indicated with 1, with a bottom 1a and a cap 1b, overlapped in vertical direction (in a not illustrated way, the capsule 1 is carried by a capsule-holding wheel, in a way altogether similar to the capsule-holding wheel 2 illustrated in FIG. 1).

The weighing device, here indicated with 10, is made in a casing 10' of suitable material, for example aluminium alloy, and comprises, at a surface thereof facing the capsule 1, a plurality of detection electrodes $S_1, S_2, \ldots, S_n$ (FIG. 3 is purely indicative as regards the number of illustrated electrodes), plated with a material suitable for the pharmaceutical environment, for example gold, defining distinct sectors of a first capacitive detection plate 5a.

In the same way as discussed above, the second capacitive plate 5b is also in this case defined by the capsule-holding wheel (not shown here), placed at a reference potential, which carries the capsules 1 that must be weighed, so that they are in a position facing the weighing device 10. In particular, each detection electrode $S_1, S_2, \ldots, S_n$ is placed in a position facing a respective sector in which the capsule 1 can be assumed to be vertically divided.

Figure 4:
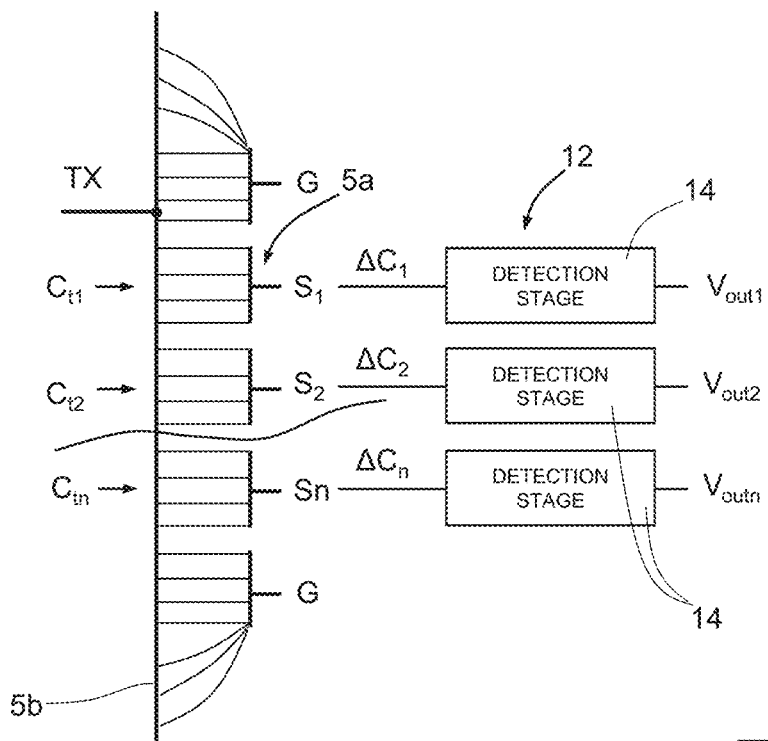
FIG. 4 shows an equivalent electrical scheme of the weighing device shown in FIG. 3.

As also shown in the equivalent diagram in FIG. 4, the various detection electrodes $S_1, S_2, \ldots, S_n$ form with the second common plate 5b a plurality of detection capacitors $C_{t1}, C_{t2}, \ldots, C_{tn}$, a respective capacitive variation $\Delta C_1, \Delta C_2, \ldots, \Delta C_n$ being, during operation, indicative of the weight of a corresponding sector of the capsule 1 (when the same capsule 1 is interposed between the weighing device 10 and the capsule-holding wheel).

The weighing device 10 is also provided with an electronic circuit 12, which can be housed in the casing 10', which comprises in this case a plurality of detection stages 14, each coupled to a respective detection electrode $S_1, S_2, \ldots, S_n$ in order to be operatively coupled to a respective detection capacitor $C_{t1}, C_{t2}, \ldots, C_{tn}$, to provide an output quantity $V_{out1}, V_{out2}, \ldots, V_{outn}$, in the example an electrical voltage, which is a function of the respective capacitive variation $\Delta C_1, \Delta C_2, \ldots, \Delta C_n$ and is indicative of the weight of the corresponding sector of the capsule 1.

The weighing device 10 is configured in such a way that each detection electrode $S_1, S_2, \ldots, S_n$ refers only (or mainly) to the capsule sector 1 facing it; in particular, the electric-field flow lines are, with a certain approximation, parallel to each other and perpendicular to the surface of the detection electrodes $S_1, S_2, \ldots, S_n$ and of the facing second plate 5b (as shown in the same FIG. 4). In a transducer with flat and parallel plates (as the disclosed capacitive sensor can be approximated to), if the detection electrodes $S_1, S_2, \ldots, S_n$ are at the same potential and are delimited at the ends by guard electrodes G also at the same potential, as shown in FIG. 4 above, the relevant electric field lines are all parallel to each other. The detection stages 14 are also independent from each other and configured to detect in a substantially exclusive and independent manner the capacitive variation $\Delta C_1, \Delta C_2, \ldots, \Delta C_n$ of the respective detection capacitor $C_{t1}, C_{t2}, \ldots, C_{tn}$.

These guard electrodes G, placed above and below the detection electrodes $S_1, S_2, \ldots, S_n$ (in the vertical direction), placed at a suitable electrical potential, are used to eliminate the effects of the electric-field edge (in a per-se known manner, not described in detail herein).

The present Applicant has verified that, in order for the weighing device 10 to be effective, a suitable electronic circuit 12 has to be provided, in particular a suitable circuit configuration of the relative detection stages 14.

Figure 2:
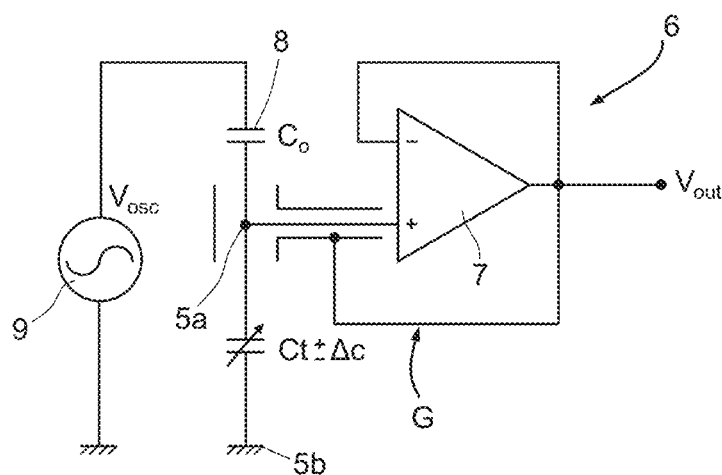
FIG. 2 shows an electronic detection circuit used in a weighing device of the filling machine in FIG. 1.

In this respect, the present Applicant has found that it is substantially impossible to use the detection circuit 6, of the type known as "capacitive divider", described with reference to FIG. 2. In fact, in addition to the intrinsic limitations described above, this circuit is not suitable for use with a "segmented" capacitive sensor.

Figure 5:
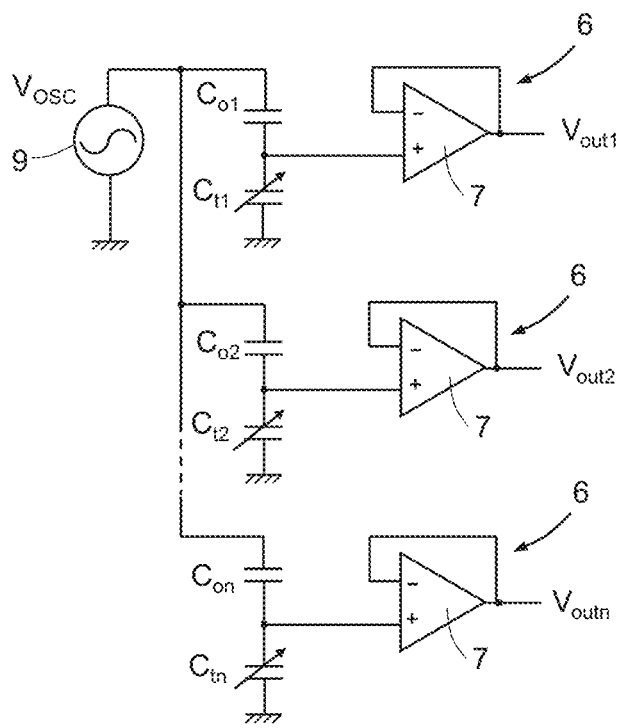
FIG. 5 shows a layout of a known type of detection circuit that could be applied to the weighing device in FIG. 3.

Indeed, FIG. 5 shows the above-mentioned detection circuit 6 applied to the plurality of detection electrodes $S_1, S_2, \ldots, S_n$ of the weighing device 10.

All detection electrodes $S_1, S_2, \ldots, S_n$ (and their detection capacitors $C_{t1}, C_{t2}, \ldots, C_{tn}$) are supplied by the same oscillator voltage $V_{osc}$, but through separate coupling capacitors, indicated here by $C_{o1}, C_{o2}, \ldots, C_{on}$.

The unavoidable differences in the capacity of these detection and coupling capacitors ($C_{t1}, C_{t2}, \ldots, C_{tn}$ and $C_{o1}, C_{o2}, \ldots, C_{on}$) cause a different voltage to be present on each of the detection electrodes $S_1, S_2, \ldots, S_n$. This causes an unwanted interaction between neighbouring electrodes and a consequent insufficient "focusing" of the electric-field lines. In practice, the condition that each detection electrode $S_1, S_2, \ldots, S_n$ is sensitive only to the sector of capsule 1 facing it is poorly met. Furthermore, each detection stage would not be able to detect only the capacitive variation of the respective detection capacitor.

One aspect of the present solution therefore provides a particular circuit configuration of the detection stages 14 of the electronic circuit 12 of the weighing device 10.

Figure 6:
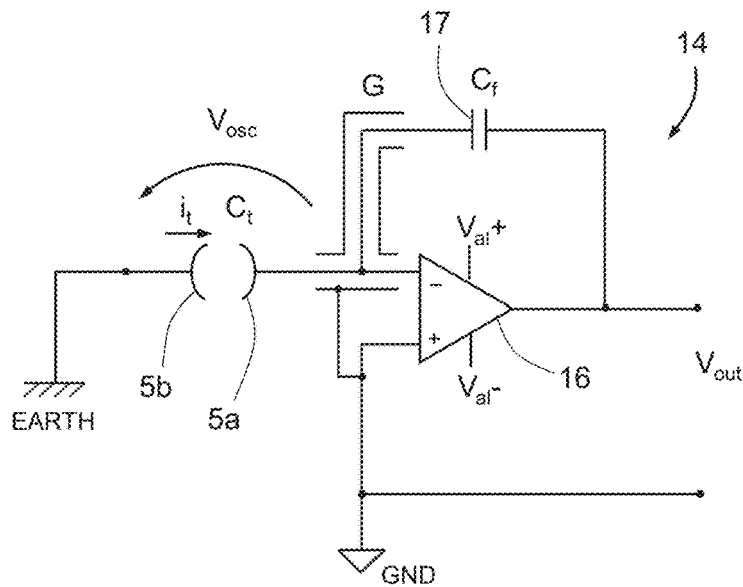
FIG. 6 shows the basic diagram of an electronic detection circuit used in the weighing device in FIG. 3, according to one aspect of the present solution.

As shown in FIG. 6, each detection stage 14 is in this case based on an operational amplifier 16, in a charge amplifier configuration, with current input.

In particular, the operational amplifier 16 has an inverting input connected to the respective sensing electrode $S_1, S_2, \ldots, S_n$ which defines the first plate 5a of the respective detection capacitor $C_{t1}, C_{t2}, \ldots, C_{tn}$ (herein indicated simply by $C_t$, for sake of simplicity) and a non-inverting input connected to the ground reference potential of the electronic circuit 12, indicated as gnd. The same inverting input is also connected to the output of the operational amplifier 16, on which a respective output quantity is present, by means of a feedback capacitor 17, with a capacity $C_f$.

As mentioned above, the second common plate 5b of the detection capacitor $C_f$ consists of the capsule-holding wheel 2 (here not shown) and is connected to the earth reference (earth).

It should be noted that two separate terms are used specifically to indicate two electrically distinct points: "ground" to indicate the common reference of the electronic circuit 12; and "earth" to indicate the actual earth reference, to which all the elements of the filling machine are connected, including the above-mentioned capsule-holding element 2.

In order for the above-mentioned charge amplifier circuit to operate correctly, the oscillator voltage $V_{osc}$ has to be present on the detection capacitor $C_t$, so that a current $i_t$ proportional to the capacitive variation $\Delta C$ is present at the inverting input of the operational amplifier 16, the capacitive variation $\Delta C$ being a function of the weight of the associated sector of the capsule 1.

A particular aspect of the present solution envisages that the ground reference gnd of the electronic circuit 12 is suitably "floating" with respect to the earth reference, i.e. "raised" with respect to the earth reference, in particular by a voltage equal to the oscillator voltage $V_{osc}$ with inverted sign ($-V_{osc}$), i.e. by the voltage driving the detection capacitor $C_t$.

It should be noted that not only the non-inverting input, but also the output and the power supply terminals of the operational amplifier 16 are referred to this "floating" ground, the power supply terminals respectively receiving a positive supply voltage $V_{al}^+$ and a negative supply voltage $V_{al}^-$ both referred to the ground reference gnd.

The present Applicant has realized that the above-mentioned charge amplifier circuit has several advantages over the traditional capacitive divider solution discussed above (in practice, the drawbacks previously listed as (a)-(d) are eliminated).

(a) Desensitization—the percentage changes in the transducer capacity $\Delta C$ refer only to the capacity $C_t$, as there is no other capacity in parallel. The parasitic capacity between the inverting terminal of the operational amplifier 16 and the ground reference gnd is "neutralized" by the operational amplifier, as it is connected to its "virtual ground".

(b) Guard—in this case it is not required to create a guard signal for driving the electrodes or guard conductors G (shown schematically). These are, in fact, printed circuit tracks, which in this case are connected to the ground reference gnd, and therefore the stability problems affecting the known solutions are avoided.

(c) Common mode—due to the current input, the operational amplifier 16 operates under very favourable conditions (the common mode voltage is null).

(d) Dynamics—the oscillator voltage $V_{osc}$ in this case is not limited by the dynamics of the operational amplifier 16 and can be increased theoretically at will, in order to increase the current $i_t$ injected into the summing node. To bring the output voltage back within the dynamics of the operational amplifier, it is sufficient to increase the capacity $C_f$ of the feedback capacitor 17, as the oscillator voltage $V_{osc}$ increases. By increasing the same oscillator voltage $V_{osc}$, the signal-to-noise ratio (S/N) can therefore be significantly improved, since it depends on the ratio between the signal currents and noise current of the operational amplifier 16, at the input of the same operational amplifier 16.

(e) Mutual influence—considering the case, typical for the segmented capacitive sensor, of a set of close electrodes, each connected to the summing node of a respective operational amplifier 16, in this case, being all the detection electrodes $S_1, S_2, \ldots, S_n$ connected to virtual grounds, the same detection electrodes $S_1, S_2, \ldots, S_n$ and the guard electrodes G are all at the same potential (that of the ground reference gnd of the electronic circuit 12). For this reason, the same detection electrodes $S_1, S_2, \ldots, S_n$ can be arranged side-by-side without creating problems of mutual influence. In particular, since all the detection electrodes $S_1, S_2, \ldots, S_n$ are at the same potential, assuming flat and parallel electrodes and guard electrodes G at the edges, the relevant electric field lines are, at least in theory, all straight and parallel.

Figure 7:
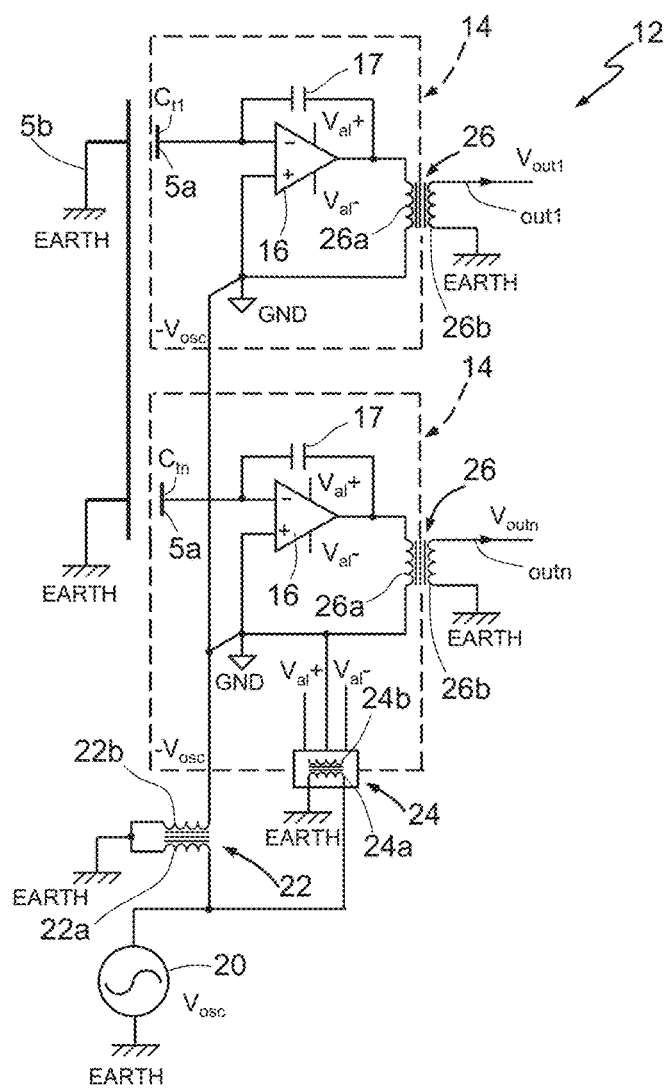
FIG. 7 shows the overall electrical layout of the detection circuit used in the weighing device shown in FIG. 3.

FIG. 7 shows the resulting circuit design for the electronic circuit 12 of the weighing device 10, according to an embodiment of the present solution (for the sake of simplicity, only two detection stages 14 are shown, associated with the first and nth detection electrode $S_1$, $S_n$; however, it is evident that what is shown here is replicated for the desired number of detection electrodes $S_1$, $S_2$, . . . , $S_n$).

The electronic circuit 12 comprises: a generator, in particular an oscillator, here denoted with 20, which generates the oscillator voltage $V_{osc}$ and is referred to the earth potential (earth); and an injection transformer 22, having a primary side 22a coupled to the same oscillator 20 and receiving the oscillator voltage $V_{osc}$ (in particular connected between the oscillator 20 and the earth reference).

The secondary side 22b of the injection transformer 22 is suitably referred to the earth reference and coupled to the ground reference gnd, so that the "floating" ground gnd is placed, with respect to the potential of the same earth reference, at the oscillator voltage $V_{osc}$. Advantageously, this injection transformer 22 can be made with a "raising" turns ratio, so as to drive the detection capacitor $C_t$ with a high voltage, while having an oscillator voltage $V_{osc}$ with a reduced value.

The electronic circuit 12 further comprises a power supply 24, having an input coupled to the oscillator 20 and receiving the oscillator voltage $V_{osc}$ (thus operating synchronously with respect to the same oscillator voltage $V_{osc}$) and providing at the output positive and negative supply voltages $V_{al}^+$, $V_{al}^-$ for the operational amplifier 12. In this way, any possible interference of the power supply circuit on the measurement circuit is fixed, easily detectable and can be possibly neutralized.

In particular, the power supply 24 comprises internally (as shown schematically in the same FIG. 7) an insulation transformer to isolate the primary side 24a, referred to the earth reference, and the secondary side 24b, referred to the floating ground gnd.

In particular, it should be noted that the above-mentioned injection transformer 22 and the above-mentioned power supply 24 are in common for all the detection stages 14 of the electronic circuit 12.

Each detection stage 14 of the same electronic circuit 12 moreover comprises an output transformer 26, which refers the output of the respective operational amplifier 16 to the earth potential, which is the reference for all the other electronics (not shown here).

The output transformer 26 therefore comprises a primary side 26a connected between the output of the same operational amplifier 16 and the ground reference potential gnd, and a secondary side 26b referred to the earth reference and providing the respective output voltage $V_{out1}$, $V_{out2}$, . . . , $V_{outn}$ at a respective output terminal $out_1$, $out_2$, . . . , $out_n$.

As schematically represented by the dashed rectangle of FIG. 7, the detection stages 14 of the electronic circuit 12 are therefore referred to the floating ground gnd of the same electronic circuit 12, while the injection transformer 22, the power supply 24 and the output terminals $out_1$, $out_2$, . . . , $Out_n$ (as well as the common plate 5b of the detection capacitors $C_{t1}$, $C_{t2}$, . . . , $C_{tm}$) are referred to the earth potential.

It should also be noted that the injection transformer 22, the insulation transformer in the power supply 24 and the output transformer 26 are low capacity transformers between the primary and secondary sides, are miniaturized and have a very extended frequency response.

Figure 8:
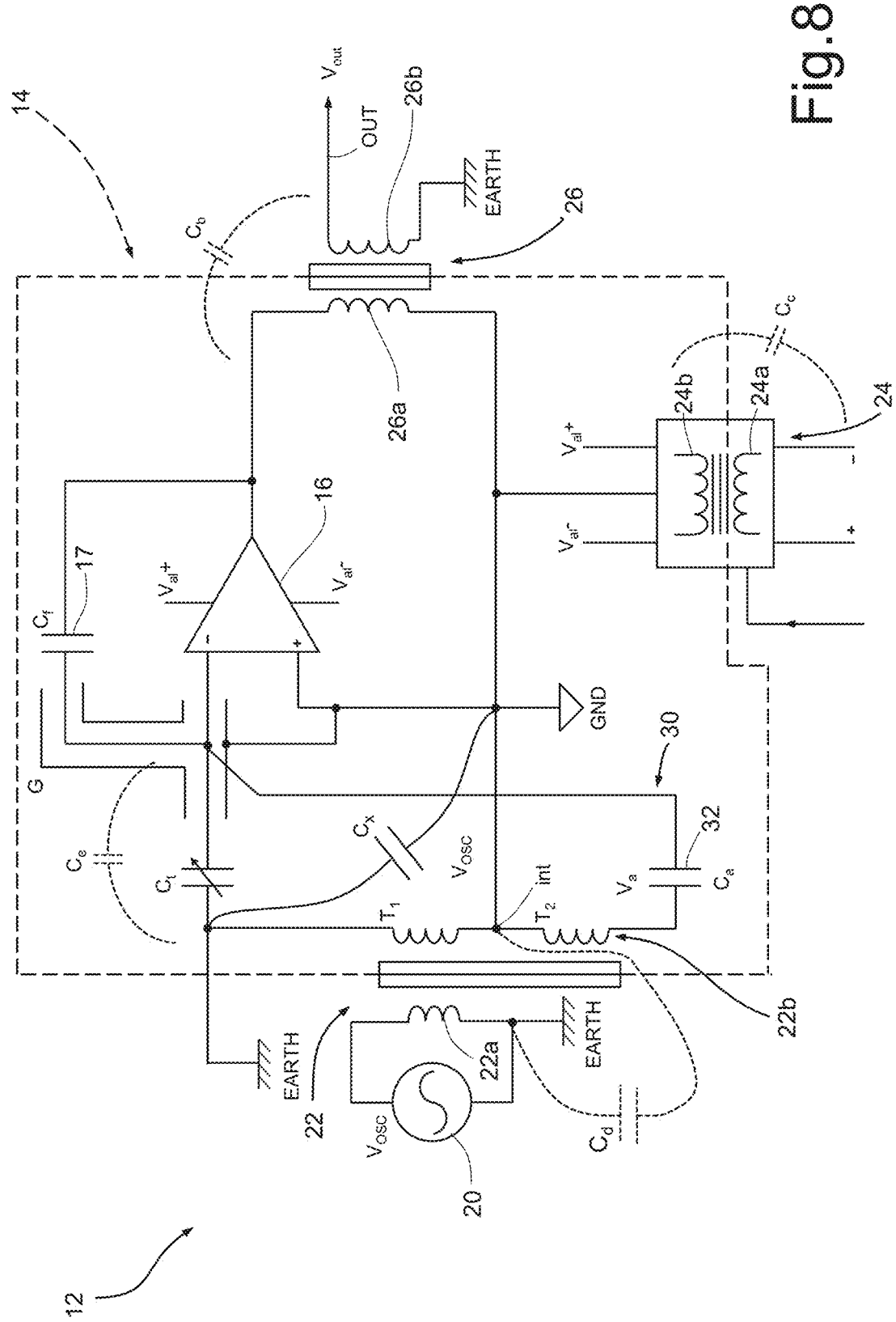
FIG. 8 shows a first variant of the detection circuit.

As shown in FIG. 8 (for the sake of simplicity, with reference to a single detection stage 14), the electronic circuit 12 can also comprise a zero-setting stage 30, for each detection stage 14, in this case provided internally to the "floating" part of the same detection stage 14 (i.e. referred to the reference ground gnd).

The injection transformer 22 has in this case a secondary side 22b with an intermediate tap int, defining: a first secondary winding, indicated with $T_1$ connected between the intermediate tap int and the ground reference gnd for the injection of the oscillator voltage $V_{osc}$ with inverted sign ($-V_{osc}$); and a second secondary winding, indicated with $T_2$, connected between the same intermediate tap int and the inverting input of the operational amplifier 12, through the interposition of a zero-setting capacitor element 32, having capacity $C_a$.

On the second secondary winding $T_2$ a suitable zero-setting voltage $V_a$ is in this case generated, in phase opposition with respect to the oscillator voltage $V_{osc}$, which allows, together with the choice of a suitable variable value for the capacity $C_a$ of the zero-setting capacitor element 32 (implemented for example by a varactor diode, commonly called "varicap"), to implement the zero-setting of the output of the operational amplifier 12. It should be noted that, for this zero-setting, both the zero-setting voltage $V_a$ and the value of the above-mentioned capacity $C_a$ of the zero-setting capacitor 32 can be varied with known techniques.

In particular, the zero-setting capacitor 32 injects into the summing node of the operational amplifier a current equal to and opposite to that injected by the detection capacitor $C_t$ when the latter is in a "zero" situation, i.e. the one starting from which the capacitive variations $\Delta C$ are to be measured. The output voltage $V_{out}$, transmitted at the output out through the appropriate output transformer 26, is therefore null in the zero condition, or otherwise has a reduced amplitude, and can therefore be amplified directly (by appropriate signal processing circuits, not illustrated, located downstream of the electronic circuit 12).

FIG. 8 also shows the guard (or shield) lines G of the electronic circuit 12, suitably referred to the potential of the ground reference gnd, floating with respect to the earth reference. As it will be evident to a person skilled in the art, these guard lines G can be tracks on the printed circuit board in which the electronic circuit 12 is made, or they can be metal screens avoiding that the capacity towards the earth potential of some circuit elements is in parallel with the transducer (the detection capacitor $C_t$), reducing the sensitivity and constituting a potential source of instability in the measurement.

In the same FIG. 8 the power supply 24 is shown, in this case receiving a signal from the same oscillator 20, so as to operate at the same frequency and thus avoid the drawbacks described above.

The parasitic capacities acting in the circuit are also shown, and in particular the capacity $C_e$ between the earth reference and the ground reference, and the capacities $C_d$, $C_c$ e $C_b$, between the primary and secondary sides of the injection, power supply and output transformers 22, 24, 26.

Figure 9:
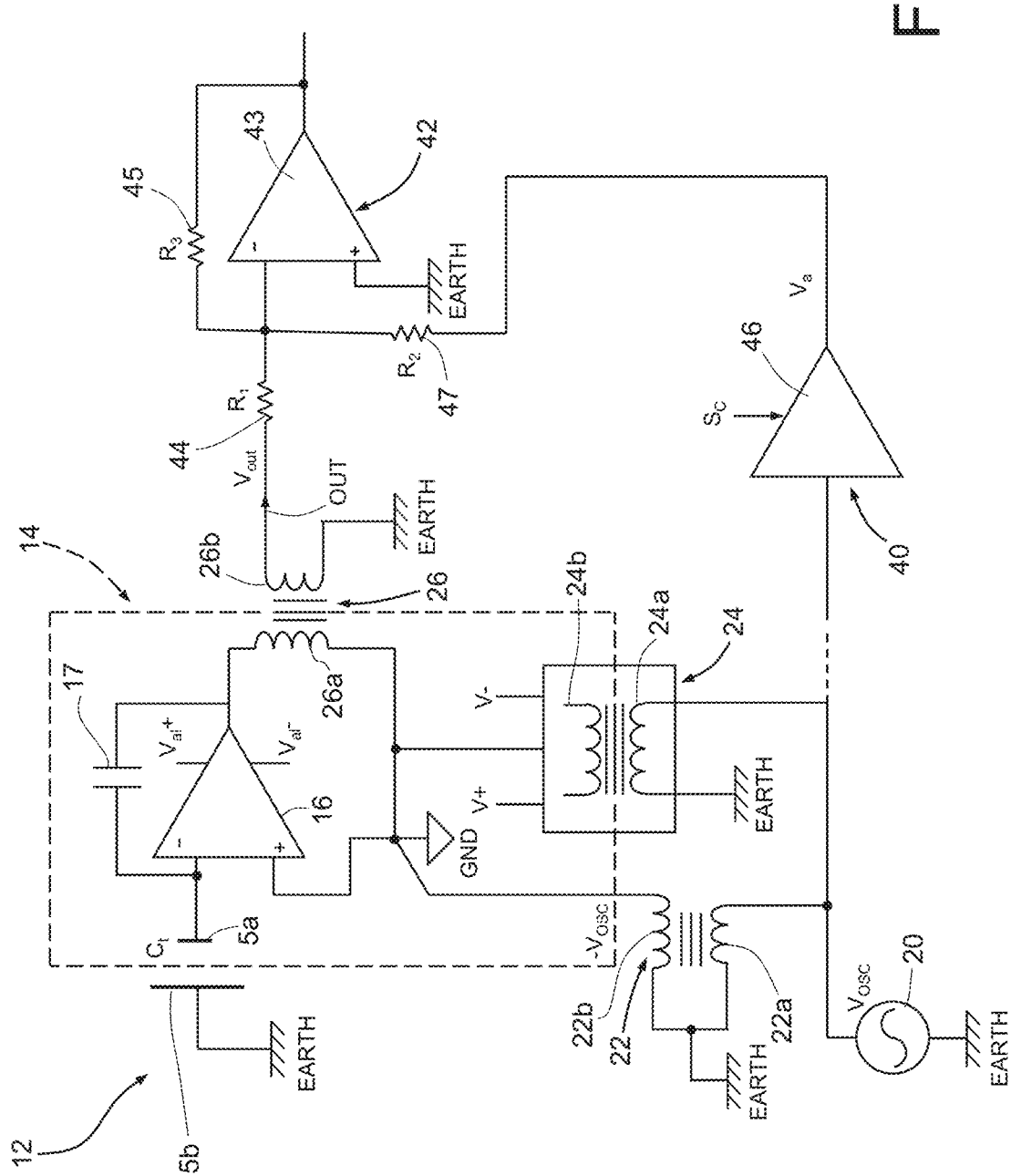
FIG. 9 shows a second variant of the detection circuit.

In an alternative embodiment illustrated in FIG. 9, instead of being provided inside the "floating" part of the detection stage 14 referred to the ground reference gnd, zero-setting is performed externally to it, being therefore referred to the earth reference. This embodiment can be advantageous, as it does not require to carry digital signals in the "floating" part of the circuit to control the zero-setting (for example, for the variation of the above-mentioned zero-setting capacitor element 32).

In this embodiment, for each detection stage 14 the zero-setting stage, indicated in this case as 40, comprises an adder stage 42, connected downstream of the output out of the same detection stage 14.

This adder stage 42 consists of an amplifier 43, in adder configuration, with non-inverting input connected to the earth reference, and inverting input coupled to the above output out by means of a first summing resistor 44, with resistance R1, and also coupled to the output of the same amplifier 43 by means of a second summing resistor 45, with resistance R3.

The zero-setting stage 40 also comprises a digitally controlled variable-gain amplifier 46, for example implemented by a multiplying D/A converter (as will be evident to a person skilled in the art).

This variable-gain amplifier 46 receives, at the input, an input signal suitably obtained from the oscillator 20 and also a digital control signal $S_c$, and provides at the output a zero-setting voltage $V_a$, by means of appropriate adjustment by the digital control signal $S_c$.

The output of the variable-gain amplifier 46 is coupled to the inverting input of the above-mentioned operational amplifier 43 of the adder stage 42 by means of a third summing resistor 47, with resistance R2. If R1 is equal to R2, the output zero-setting is obtained when the zero-setting voltage $V_a$ is equal in amplitude and in phase opposition to the output voltage $V_{out}$ provided by the detection stage 14.

The present Applicant has verified the operation of the weighing device 10 described above by means of several simulations and experimental tests.

Figures 10A, 10B:
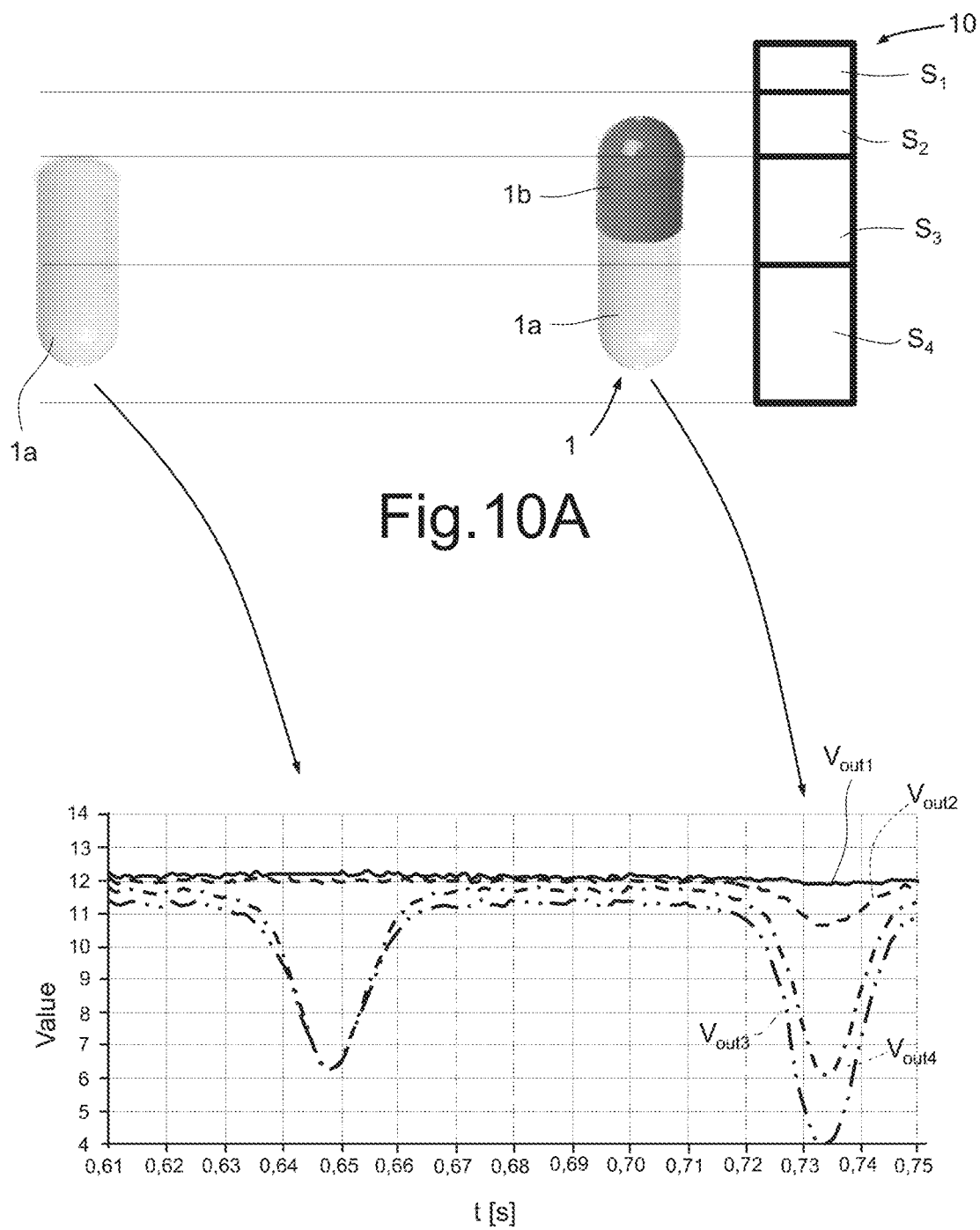
FIG. 10A shows an exemplary application of the weighing device, facing one capsule.
FIG. 10B shows plots of quantities at output from the detection circuit, referring to the example in FIG. 10A.

In this respect, FIG. 10B shows the trend of the output voltages $V_{out1}$, $V_{out2}$, $V_{out3}$ and $V_{out4}$ referred to the respective detection electrodes $S_1$, $S_2$, $S_3$ and $S_4$, in the example shown in FIG. 10A. In particular, as shown in FIG. 10A, the weighing device 10 comprises in this case a "segmented" capacitive sensor consisting of four detection electrodes $S_1$, $S_2$, $S_3$ and $S_4$, suitably arranged facing the capsule 1, so that: one detection electrode $S_1$ is located above the cap 1b of capsule 1; the second detection electrode $S_2$ is located facing only a top portion of the cap 1b of the capsule 1; the third electrode $S_3$ is located facing a lower portion of the cap 1b of the capsule 1, which overlaps a top portion of the bottom 1a of the same capsule 1; and a fourth electrode $S_4$ is located facing only a lower portion of the bottom 1a of the capsule 1.

In particular, the above mentioned FIG. 10B shows, at the left portion, the trend of the above-mentioned output voltages $V_{out1}$, $V_{out2}$, $V_{out3}$ and $V_{out4}$ for a capsule 1 without the cap 1b; and on the right portion, the trend of the same output voltages $V_{out1}$, $V_{out2}$, $V_{out3}$ and $V_{out4}$ for a capsule 1 provided with the cap 1b.

In particular, it can be noted that processing of the output voltage trend, in this particular case of the second and third output voltage $V_{out2}$, $V_{out3}$, which, clearly, are significantly different in the two cases of absence and presence of the cap 1b, allows to effectively detect the presence of a capsule 1 without the cap 1b. Furthermore, it should be noted that the output voltage $V_{out1}$ referred to the first detection electrode $S_1$ is not affected by the presence or absence of the cap 1b, the first detection electrode $S_1$ being in fact placed above the cap 1b; similarly, the output voltage $V_{out4}$ referred to the fourth detection electrode $S_4$ is not affected by the presence or absence of the cap 1b, being in fact facing only a portion of the bottom 1a of the same capsule 1. The behaviour of these output voltages $V_{out1}$, $V_{out4}$ therefore highlights the excellent "spatial selectivity" in the capacitive detection implemented by the weighing device 10.

The advantages of the present solution are evident from the above description.

In any case, it should be noted again that this solution allows to obtain not only information about the presence/absence of the capsule cap, in order to discard capsules without a cap during filling, but also, advantageously, to detect in a differentiated and selective manner the contributions provided to the weight measurement from the various parts of the same capsule, obtaining information about the amount of material in the various sectors in which the capsule can be divided. This can be very useful in various cases, for example when the capsule is filled with different products (for example, powder and micro-pills), for a better evaluation of the weight of the product compared to a single measure.

In fact, the weighing device implements a "segmented" capacitive detection, having a plurality of detection segments "focused" almost exclusively on a respective sector of the capsule, thanks also to the configuration of the electronic circuit, in which the active and guard electrodes are all at the same potential so that the electric-field lines of the various detection segments do not affect each other.

The weighing device is also suitable to adapt to various capsule formats, with an appropriate arrangement of the detection segments, without the need to replace it, for example when changing the format of the capsules to be filled.

Lastly, it is clear that modifications and variations may be made to what described and illustrated herein without departing from the scope of the present invention, as set forth in the claims.

In particular, the potential of the ground reference in the electronic circuit, floating with respect to the earth reference, could be generated by an operational amplifier, rather than by an insulation transformer; similarly, the output voltage could be referred to the floating ground again by an operational amplifier, rather than by an insulation transformer. However, such a solution would cause some problems, due to the high common mode voltage in the above-mentioned operational amplifier.

Finally, it should be noted that, although described with particular reference to the weighing of capsules for pharmaceutical use, the present solution may also be successfully applied to capsules, or similar containers, containing a different product.

The invention claimed is:
1. An electronic device (10) for detecting the weight of a capsule (1) for a pharmaceutical product, comprising:
a plurality of detection electrodes ($S_1$, $S_2$, . . . , $S_n$), which are designed to face a respective one of a plurality of sectors into which said capsule (1) is divided in a main extension direction thereof, each one of said detection electrodes ($S_1$, $S_2$, . . . , $S_n$) being designed to form a respective detection capacitor ($C_{t1}$, $C_{t2}$, . . . , $C_{tn}$) with a common plate (5b) defined by a capsule-holding element (2) designed to hold said capsule (1); and
an electronic circuit (12) including a plurality of detection stages (14), each operatively coupled to a respective one of said detection electrodes ($S_1$, $S_2$, . . . , $S_n$) and configured to detect, in an independent and exclusive manner, a capacitive variation ($\Delta C_1$, $\Delta C_2$, . . . , $\Delta C_n$) of the respective detection capacitor ($C_{t1}$, $C_{t2}$, . . . , $C_{tn}$) and to generate a respective output quantity ($V_{out1}$, $V_{out2}$, . . . , $V_{outn}$), which is a function of said capacitive variation ($\Delta C_1$, $\Delta C_2$, . . . , $\Delta C_n$) and indicative of the weight of the respective sector of said capsule (1).

2. The device according to claim 1, wherein said common plate (5b) is designed to be coupled to an earth reference (earth), and wherein said detection stages (14) are referred to a ground reference (gnd), which is distinct and floating relative to said earth reference (earth); wherein said ground reference (gnd) is set, relative to said earth reference (earth), at a detection voltage ($V_{osc}$) designed to drive said detection capacitors ($C_{t1}$, $C_{t2}$, . . . , $C_{tn}$).

3. The device according to claim 2, wherein each one of said detection stages (14) comprises an operational amplifier (16) in charge amplifier configuration, having a non-inverting terminal connected to the ground reference (gnd) and an inverting terminal connected to the respective detection electrode ($S_1$, $S_2$, . . . , $S_n$) and to the output of said operational amplifier (16) by means of a feedback capacitor (17); wherein power supply terminals and said output of said operational amplifier (16) are referred to said ground reference (gnd).

4. The device according to claim 3, wherein said electronic circuit (12) comprises, in common and externally to said detection stages (14): a generator (20), which is configured to generate an oscillator voltage ($V_{osc}$) referred to said earth reference (earth); and an insulation element (22), which is configured to transfer, in an insulated manner, said oscillator voltage ($V_{osc}$) onto said ground reference (gnd), in order to provide said detection voltage ($V_{osc}$) to drive said detection capacitors ($C_{t1}$, $C_{t2}$, . . . , $C_{tn}$).

5. The device according to claim 4, wherein said insulation element is an insulation transformer (22), with a primary side (22a) coupled between said generator (20) and said earth reference (earth) and a secondary side (22b) coupled to the ground reference (gnd).

6. The device according to claim 5, wherein each one of said detection stages (14) is further provided with a zero-setting stage (30) for the output of the respective operational amplifier (16); wherein said insulation transformer (22) has a secondary side (22b) with an intermediate tap (int) defining: a first secondary winding ($T_1$) connected between the intermediate tap (int) and the ground reference (gnd) so as to provide said detection voltage ($V_{osc}$); and a second secondary winding ($T_2$) connected between the intermediate tap (int) and the inverting input of the operational amplifier (12), through the interposition of a zero-setting capacitor element (32) having a variable value to set the zero-value of the output of the respective operational amplifier (16).

7. The device according to claim 4, wherein said electronic circuit (12) further comprises, in common and externally to said detection stages (14): an insulated power supply (24), configured to generate a positive supply voltage ($V_{al}^+$) and a negative supply voltage ($V_{al}^-$), referred to said ground reference (gnd), for the power supply terminals of said operational amplifier (16), based on said oscillator voltage ($V_{osc}$) referred to said earth reference (earth); said insulated power supply (24) including internally a respective insulation transformer having a primary side (24a) referred to said earth reference (earth) and coupled to said generator (20), and a secondary side (24b) referred to said ground reference (gnd) and coupled to said power supply terminals of said operational amplifier (16).

8. The device according to claim 4, wherein each detection stage (14) further comprises internally an output transformer (26) having a primary side (26a) referred to said ground reference (gnd) and coupled to the output of the respective operational amplifier (16), and a secondary side (26b) referred to said earth reference (earth) and coupled to a respective output ($out_1$, $out_2$, . . . , $out_n$) to which the respective output quantity ($V_{out1}$, $V_{out2}$, . . . , $V_{outn}$) is supplied.

9. The device according to claim 8, wherein said electronic circuit (12) comprises, for each one of said detection stages (14), a zero-setting stage (40) for the output of the respective operational amplifier (16) including: an amplifier (43), in adder configuration, having a summing node coupled to the output ($out_1$, $out_2$, . . . , $out_n$) of the detection stage (14); and a variable-gain amplifier (46) coupled to said summing node and supplying a zero-setting voltage ($V_a$), having the same amplitude of and being in phase opposition with the oscillator voltage ($V_{osc}$), to set the zero value of the output of the respective operational amplifier (16).

10. The device according to claim 2, wherein each one of said detection stages (14) further comprises shielding conductors (G), which are electrically connected to said ground reference (gnd) and are designed to shield said operational amplifier (16) from interferences coming from the outside of said detection stages (14).

11. The device according to claim 1 and comprising a casing (10'), which has a surface designed to face said capsule (1), on which said detection electrodes ($S_1$, $S_2$, . . . , $S_n$) are arranged, and houses, internally, said electronic circuit (12).

12. A system for detecting the weight of a capsule (1) containing a pharmaceutical product, comprising: a capsule-holding element (2), which is designed to hold said capsule (1); and an electronic device (10) according to claim 1, arranged to face said capsule (1) in order to detect the weight of the sectors into which said capsule (1) is divided in a main extension direction thereof.

13. The system according to claim 12, wherein said sectors comprise at least a cap sector (1b) and a bottom sector (1a) of said capsule (1); and wherein said electronic device (10) is further configured to provide an indication of presence or absence of the cap (1b) of said capsule (1).

14. A method for detecting the weight of a capsule (1) for a pharmaceutical product, comprising detecting, with a capacitive technique, the weight of a plurality of sectors into which said capsule (1) is divided in a main extension direction thereof; wherein detecting comprises:
arranging a plurality of detection electrodes ($S_1$, $S_2$, . . . , $S_n$) so that they face a respective sector among the plurality of sectors of the capsule (1), each one of said detection electrodes ($S_1$, $S_2$, . . . , $S_n$) being designed to form a respective detection capacitor ($C_{t1}$, $C_{t2}$, . . . , $C_{tn}$) with a common plate (5b) defined by a capsule-holding element (2) holding said capsule (1); and
generating a respective output quantity ($V_{out1}$, $V_{out2}$, . . . , $V_{outn}$), which is a function, in an independent and exclusive manner, of the capacitive variation ($\Delta C_1$, $\Delta C_2$, . . . , $\Delta C_n$) of the respective detection capacitor ($Ct_1$, $Ct_2$, . . . , $C_{tn}$) and indicative of the weight of the respective sector of said capsule (1), by means of an electronic circuit (12) including a plurality of detection stages (14), each operatively coupled to a respective one of said detection electrodes ($S_1$, $S_2$, . . . , $S_n$).

15. The method according to claim 14, comprising electrically insulating said detection stages (14), which are referred to a ground reference (gnd), with respect to a generator (20), which generates an oscillator voltage ($V_{osc}$) referred to an earth potential (earth), to which said common plate (5b) is coupled, so that said ground reference (gnd) is set, floating relative to said earth reference (earth), at a detection voltage based on the oscillator voltage ($V_{osc}$).

* * * * *